United States Patent [19]

Matsuda

[11] Patent Number: 4,764,931
[45] Date of Patent: Aug. 16, 1988

[54] SEMICONDUCTOR DEVICE

[75] Inventor: Osamu Matsuda, Kanagawa, Japan

[73] Assignee: Sony Corporation, Tokyo, Japan

[21] Appl. No.: 841,797

[22] Filed: Mar. 20, 1986

[30] Foreign Application Priority Data

Mar. 23, 1985 [JP]  Japan .............................. 60-42245[U]

[51] Int. Cl.⁴ .......................... H01S 3/13; H01S 3/19; H01L 31/12
[52] U.S. Cl. ....................................... 372/29; 357/19; 372/50
[58] Field of Search ............... 372/29, 50, 36; 357/19, 357/74, 81

[56] References Cited

U.S. PATENT DOCUMENTS 4,338,577  7/1982  Sato et al. ......................... 372/29 X

FOREIGN PATENT DOCUMENTS 1703460  6/1967  United Kingdom .
1483849  8/1977  United Kingdom .

Primary Examiner—William L. Sikes
Assistant Examiner—Georgia Y. Epps
Attorney, Agent, or Firm—Hill, Van Santen, Steadman & Simpson

[57] ABSTRACT

A semiconductor laser device having a first photodetector constructed on one major surface of a semiconductor substrate, a semiconductor laser chip mounted on the major surface adjacent to the first photodetector, and a second photodetector constructed on the major surface adjacent to the first photodetector at the side thereof opposite to the semiconductor laser chip, said second photodetector being positioned during manufacture to detect emissions from the laser chip of an adjacent fixedly positioned laser device.

7 Claims, 8 Drawing Sheets

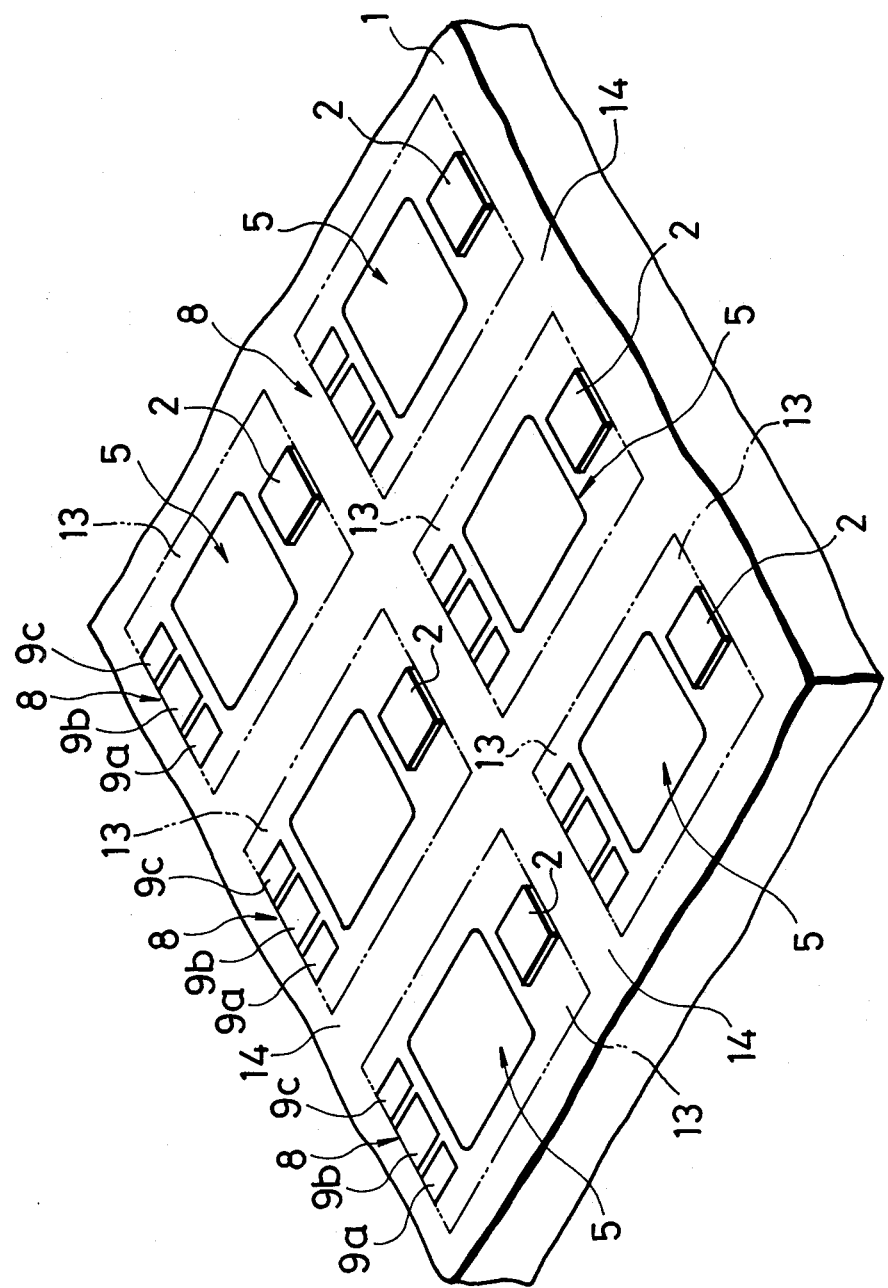

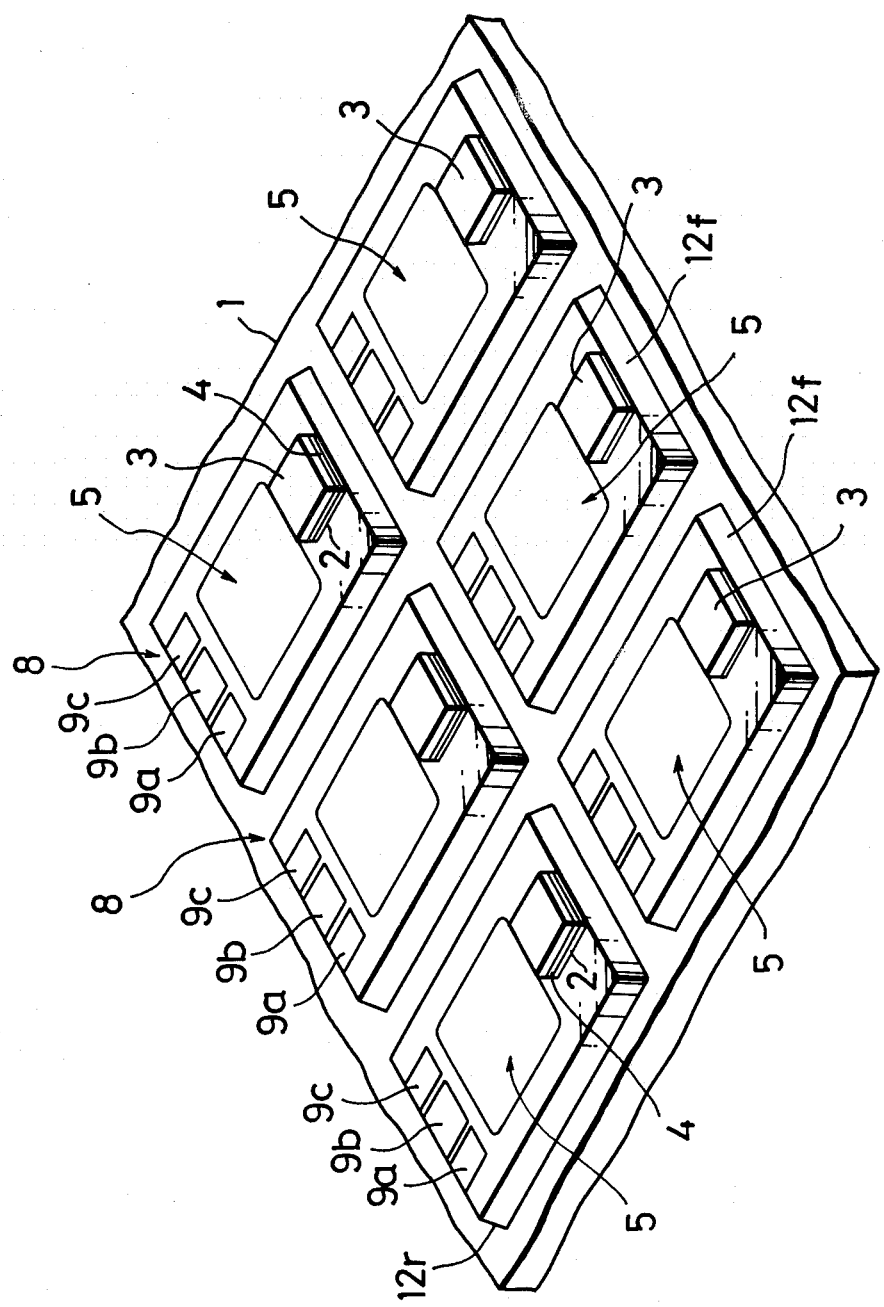

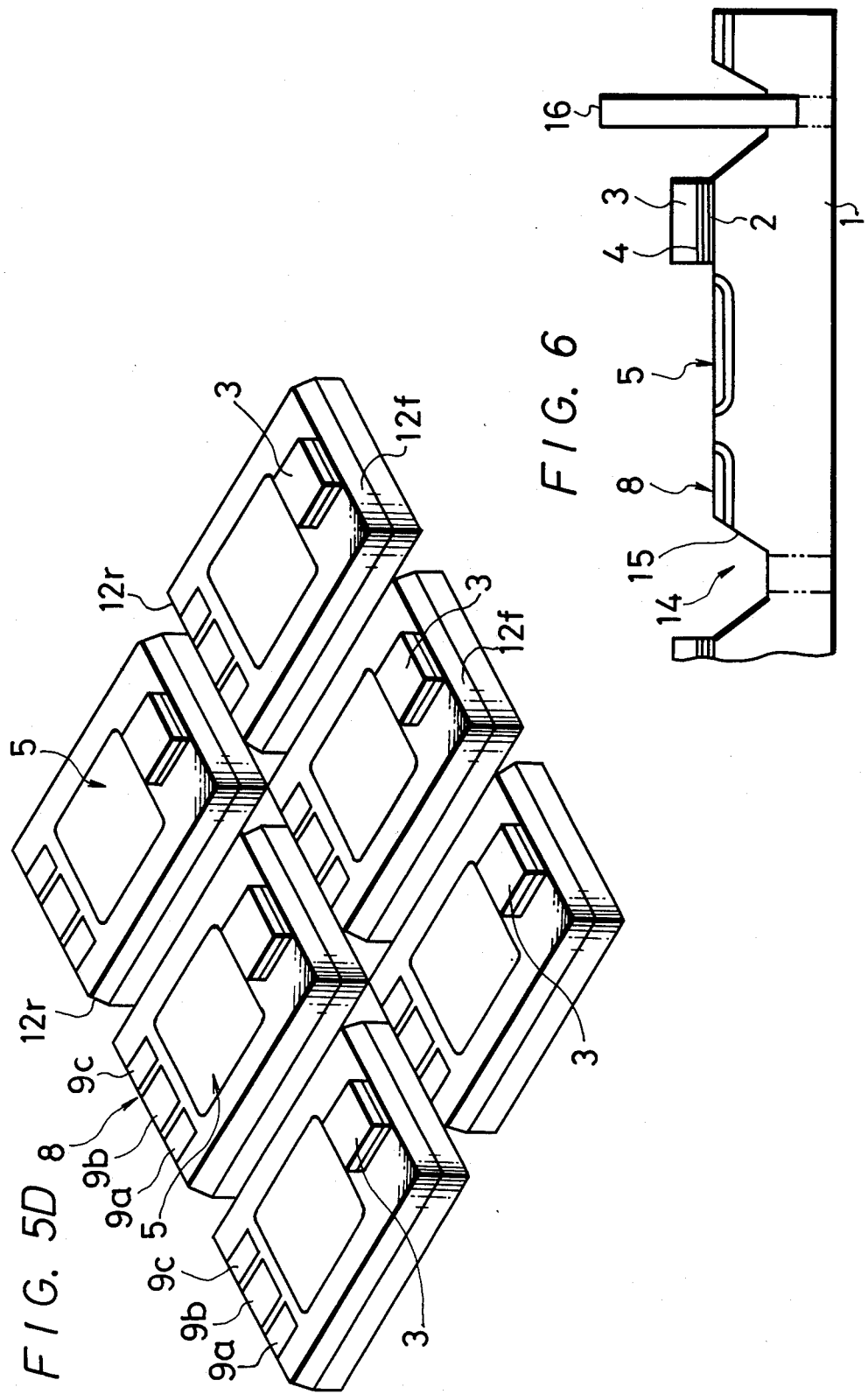

SEMICONDUCTOR DEVICE

BACKGROUND OF THE INVENTION

1. Field of the Invention

The present invention relates generally to semiconductor laser devices and, more particularly, is directed to a semiconductor laser device in which a semiconductor laser chip is mounted on a part of a semiconductor substrate on which an APC (automatic power control) photodiode is formed.

2. Description of the Prior Art

In the prior art, as a semiconductor laser device, there is a semiconductor laser device as shown in FIG. 1 in which an APC (automatic power control) photo diode b is formed on a surface portion of a semiconductor substrate (e.g., N+ type) a and a semiconductor laser chip c is mounted on a portion of the semiconductor substrate a near the portion where the APC photodiode b is formed. Then, as a manufacturing method for producing such semiconductor laser device, the method as generally shown in FIG. 2 has been proposed by applicant. This previously proposed manufacturing method will be described briefly. At first, as shown in FIG. 2A, by carrying out a series of treatments for a semiconductor wafer containing a plurality of substrates a, a, a, an APC photodiode b is formed on a part of each of the element-forming regions d d . . . . In FIG. 2A, reference letters f designate lines which partition the adjacent element-forming regions d, d, . . . and along which the element-forming regions d, d, . . . are to be diced. Then, as shown in FIG. 2B, the surface of the semiconductor wafer is half-diced along the lines f, f, . . . to thereby form grooves g, g, . . . . Thereafter, as shown in FIG. 2C, a semiconductor laser chip c is positioned on the solder layer e of each of the element-forming regions d, d, . . . . While in this state, the semiconductor wafer is passed through a heating furnace (for example at a heating temperature of 250° C.) to thereby carry out the chip bonding of the respective semiconductor laser chips c, c, . . . simultaneously to their respective substrates a, a. Then, after the electrical characteristic and the optical characteristic are measured and inspected, and the necessary screening carried out, the semiconductor wafer is separated along the grooves g, g, . . . to thereby carry out pellet separation. Thereafter, as shown in FIG. 2E, The pellet a is pellet-bonded to a heat sink i which is located on a surface of a stem not shown. Thus, leads j and j attached to the stem are wire-bonded to the laser chip c and the electrode of the APC photodiode b respectively by wires K, the semiconductor laser device being thus practically mounted.

In this prior art manufacturing method for producing the semiconductor laser device, since the semiconductor laser chip is not bonded to the semiconductor substrate of an individual pellet but is bonded to the semiconductor substrate of a wafer at element-forming regions, there is the advantage that the semiconductor laser chips can be bonded simultaneously on a vast number of element-forming regions formed on one semiconductor wafer. In addition, when the semiconductor substrate is still in the wafer state, an electrical characteristic such as a threshold current Ith and the like can be measured by using a probe, and the screening carried out. Accordingly, not only the cost necessary for the bonding of the semiconductor laser device can be decreased but also the costs necessary for the test and the screening can be decreased. Accordingly, the above mentioned method is very advantageous.

However, in the prior art, when the semiconductor substrate a is still in the wafer state, it is impossible to measure and test the intensity of the laser emission from the semiconductor laser chip c and the symmetrical property of a far field pattern thereof. If upon cracking of the semiconductor laser chip or the like, the laser emission cannot be generated or the laser emission cannot reach a prescribed reference value. Similarly, an asymmetrical property of the far field pattern may be caused relatively easily by the positional displacement of the semiconductor laser chip c in its direction relative to the semiconductor substrate (a). If such positional displacement is beyond the tolerance range, the semiconductor laser device must be regarded as a bad or inferior product. Such bad product must be removed at an early stage as possible, otherwise, the inferior semiconductor laser devices are subjected to the pellet bonding to the heat sink i and the wire bonding are useless steps are carried out. This uselessness causes the manufacturing cost of the semiconductor laser device to be increased and fights a desired decrease in the manufacturing cost of the semiconductor laser device.

OBJECTS AND SUMMARY OF THE INVENTION

Accordingly, it is an object of the present invention to provide an improved semiconductor laser device which can remove the defects encountered with the prior art semiconductor laser device.

It is another object of the present invention to provide a semiconductor laser device in which, even in the stage before the semiconductor laser device is mounted on a heat sink or a header and the like, it can be easily tested to determine whether the laser emission output reaches a predetermined level or not, whether the semiconductor laser chip is accurately positioned on the substrate and then properly bonded and whether a far field pattern as symmetrical.

According to one aspect of the present invention, there is provided a semiconductor laser device comprising:

(a) a first photodetector constructed on one major surface of a semiconductor substrate;
(b) a semiconductor laser chip mounted on said major surface adjacent to said first photodetector; and
(c) a second photodetector constructed on said major surface adjacent to said first photodetector on the side thereof opposite to said semiconductor laser chip.

These and other objects, features and advantages of the present invention will become apparent from the following detailed description of the preferred embodiment taken in conjunction with the accompanying drawings, throughout which like reference numerals designate like elements and parts.

BRIEF DESCRIPTION OF THE DRAWINGS

FIGS. 5A to 5D are perspective views respectively showing a method for manufacturing the semiconductor laer device of the invention shown in FIGS. 3 and 4 in accordance with sequential steps of the manufacturing processes;

FIG. 6 is a cross-sectional view illustrating the manner in which a region to be scribed is cut for pelletizing;

DESCRIPTION OF THE PREFERRED EMBODIMENT

Figure 1:
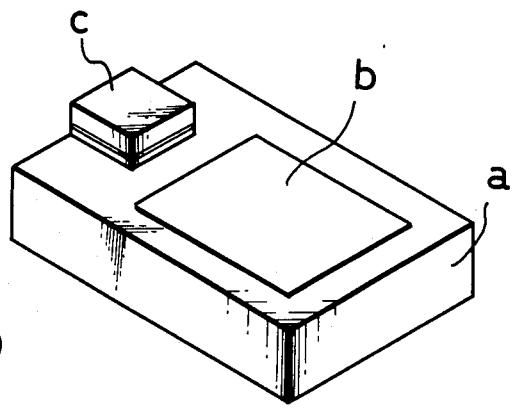
FIG. 1 is a perspective view showing an example of a prior art semiconductor laser device.
Figure 2A:
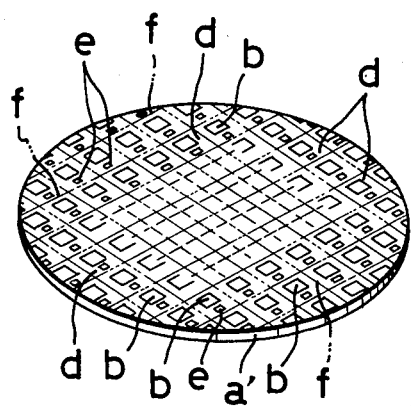
FIGS. 2A to 2E are perspective views respectively showing a prior art manufacturing method of making a semiconductor laser device as shown in FIG. 1.
Figure 2B:
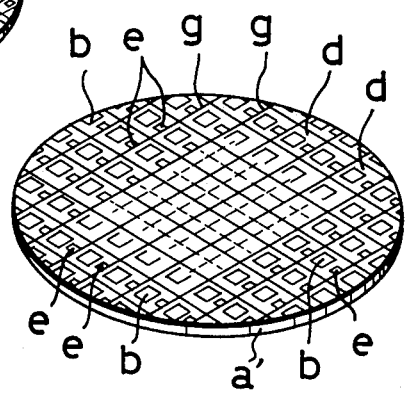
Figure 2C:
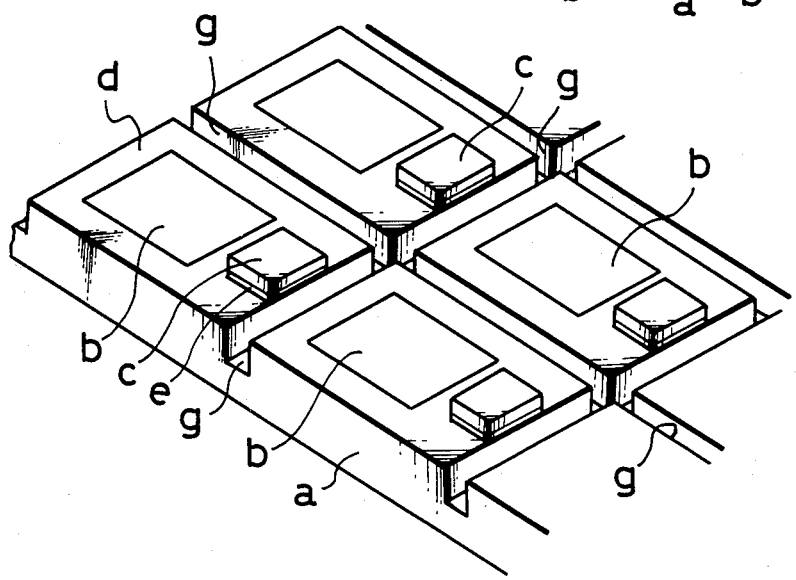
Figure 2D:
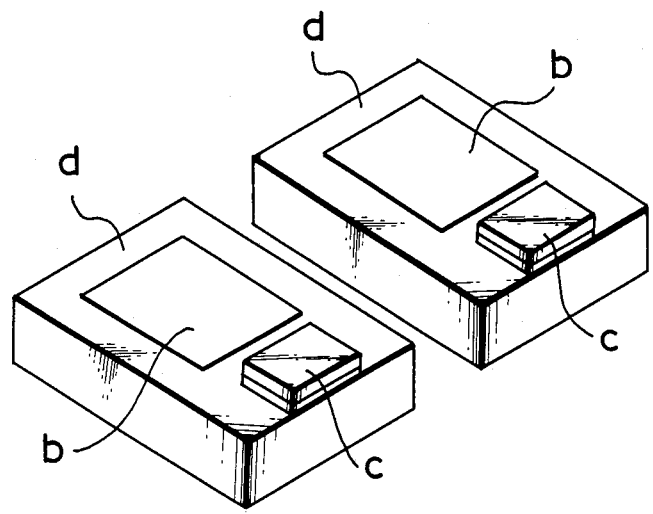
Figure 2E:
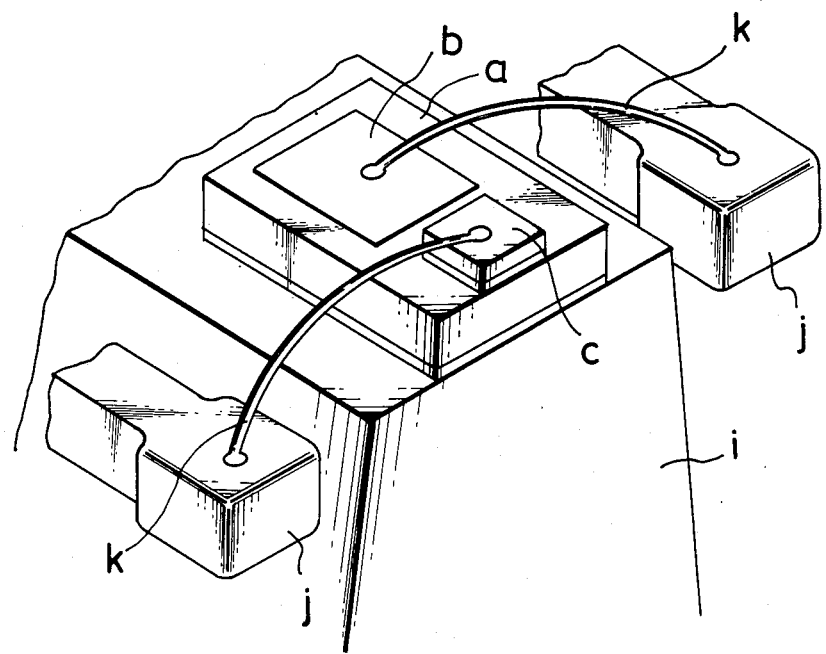
Figure 3:
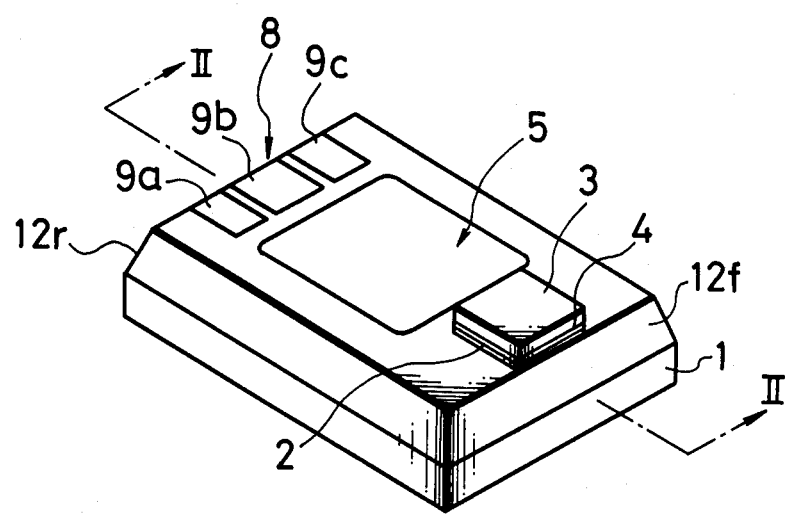
FIG. 3 is a perspective view showing an embodiment of a semiconductor laser device according to the present invention.
Figure 4:
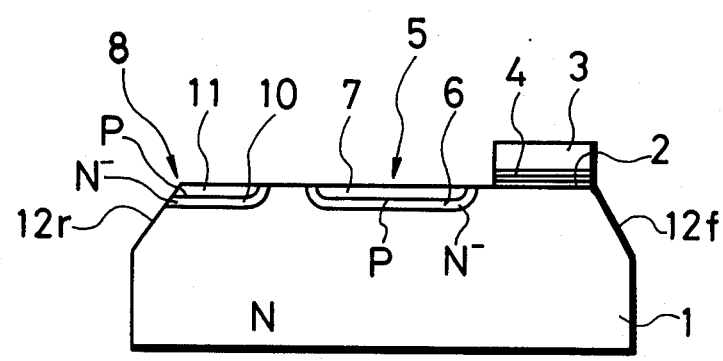
FIG. 4 is a cross-sectional view taken along a line II—II in FIG. 3.

An embodiment of a semiconductor laser device according to the present invention will hereinafter be described with reference to FIGS. 3 and 4. Throughout FIGS. 3 and 4, reference numeral 1 designates a semiconductor substrate of, for example, an N type, and reference numeral 2 designates a solder layer that is formed on a major surface of the semiconductor substrate 1 at its front region. A semiconductor laser chip 3 is fixed through the solder layer 2 to the major surface of the semiconductor substrate 1. Reference numeral 4 designates an active layer of the semiconductor substrate 1. Reference numeral 4 designates an active layer of the semiconductor laser chip 3.

Reference numeral 5 designates an APC photodiode that is formed on the major surface of the semiconductor substrate 1 at a side to the rear of the portion on which the semiconductor laser chip 3 is mounted. The APC photodiode 5 comprises the N type semiconductor substrate 1 itself, an N⁻ type semiconductor region 6 selectively formed on the major surface portion of the semiconductor substrate 1 and a P type semiconductor region 7 selectively formed on the surface portion of the semiconductor region 6.

An inspection or testing photodiode 8 is formed on the major surface of the semiconductor substrate 1 at its rear side region. This testing photodiode 8 is used to check whether the laser emission reaches a predetermined value or not and whether a far field pattern has a symmetrical property or not, etc. in the stage of the semiconductor wafer before the semiconductor laser device is manufactured as a product. The testing photodiode 8 is separated into three photodiode elements 9a, 9b and 9c. Each of the photodiode elements 9a, 9b and 9c comprises the semiconductor substrate 1 itself, an N⁻ type semiconductor region 10 selectively formed on the major surface portion of the semiconductor substrate 1 and a P type semiconductor region 11 selectively formed on the surface portion of the semiconductor region 10.

Reference numerals 12f and 12r designate inclined faces that are inclined by etching the upper portions of both front and rear end faces respectively of the semiconductor substrate 1. The above mentioned photodiodes 9a, 9b and 9c are each exposed on the inclined face 12r. In the semiconductor laser device shown in FIGS. 3 and 4, a laser beam is emitted from the front end face of the semiconductor laser chip 3, or its laser beam emission end face (toward the lower right as viewed in FIG. 3), and this laser emission is utilized to read data from, for example, an optical recording medium (e.g., laser disc or the like). A laser beam is also emitted from the rear end face of the semiconductor laser chip 3 and this laser beam emission is sensed by the APC photodiode 5. Then, on the basis of the results sensed by the APC photodiode 5, control is carried out to maintain a laser emission output constant.

The testing or inspection photodiode 8 for testing the semiconductor laser device during manufacture, is not necessary after the semiconductor laser device is completely manufactured as a product. It is utilized to inspect the laser emission output and the symmetrical property of the far field pattern in the manufacturing process, particularly in the stage before pelletizing.

In order to explain at which stage in the manufacturing process of the semiconductor laser device, emission output and the symmetrical property of the far field pattern should be inspected and tested by utilizing the inspection photodiode 8, a method for manufacturing the semiconductor laser device will be explained with reference to FIGS. 5A to 5D.

Referring to FIG. 5A, by carrying out a series of treatments on the major surface of the wafer semiconductor substrate 1 to form a photodiode, the APC photodiode 5 and the inspection photodiode 8 are formed on respective semiconductor laser device-forming regions 13, 13, . . . . Thereafter, the solder layers 2 for connecting the semiconductor laser chips 3 to the substrate are deposited on the respective semiconductor laser device-forming regions 13, 13, . . . by vaporization or selective etching. FIG. 5A illustrates the state of the semiconductor laser device after the APC photodiodes 5, the inspection photodiodes 8, and the solder layers 2 are formed thereon.

Figure 5B:
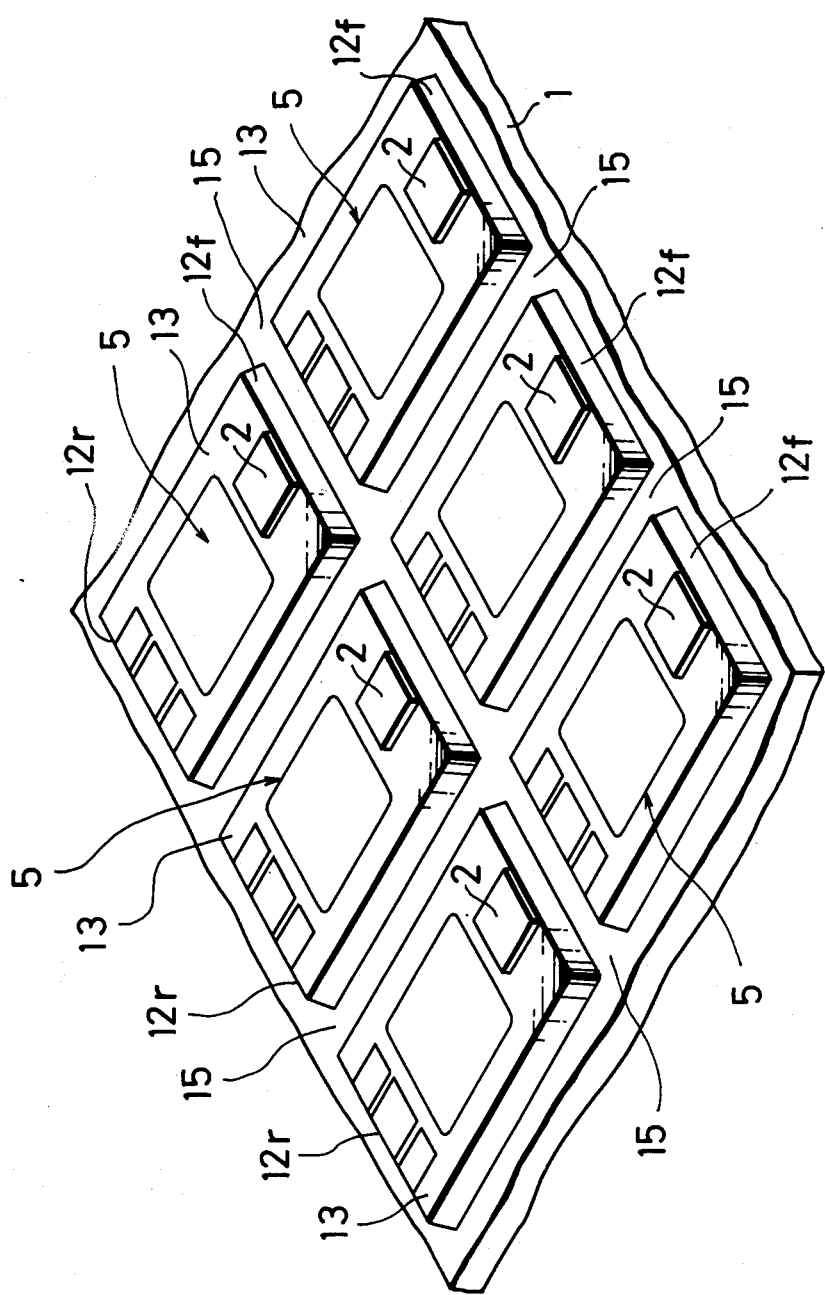

Then, referring to FIG. 5B, regions 14 to be scribed to partition the respective semiconductor laser device-forming regions 13, 13, . . . are etched to a proper depth. Reference numeral 15 designates a groove that is formed by such etching. By this etching, the inclined faces 12f and 12r are formed on the upper portions of respective front and rear end faces of the semiconductor substrate 1. When the inclined faces 12f and 12r are formed on the upper protions of both front and rear end faces of the semiconductor substrate 1 by this etching, it is possible to avoid interference that may be caused by re-reflection of the returned laser beam. Also, this etching makes the light-receiving faces of the respective photodiodes 9a, 9b and 9c clean, whereby the light-receiving efficiency thereof is increased and inspection can be carried out accurately. These points will be described in more detail.

When such etching is not carried out, both the front and rear end faces of the semiconductor laser device may become perpendicular to the surface of the semiconductor substrate 1 by the scribing. In such a case, when this semiconductor laser device is applied to, for example, an optical head of an optical reproducing apparatus which carries out 3-beam type tracking, of the laser beams emitted from the semiconductor laser chip 3 to the optical recording medium (not shown) such as a laser disc and the like, the lower laser beam reflected on the optical recording medium and returned to the front end face of the semiconductor substrate 1 is reflected on that front end face as it is and then returned to the original light path since the face of the optical recording medium has a direction, or plane, the same as that of the front end face of the semiconductor substrate 1. It is then feared that an interference, which will disturb the accurate detection of the tracking error signal, will occur. However, since the upper portions of the end face of the semiconductor substrate 1, which become the sub-mount portion of the semiconductor laser device, are formed within the inclined faces 12f and 12r by the etching treatment, the lower beam, which is returned to the front end face of the semiconductor substrate 1, is reflected in a different direction to the returning direction, so that no improper influence will be exerted upon the tracking operation. Accordingly, it is possible to carry out satisfactory tracking servo control.

Also, when the etching is not carried out, the rear end portions of the respective photodiode elements 9a, 9b and 9c of the inspection photodiode 8 formed on the rear end portions of the respective semiconductor device-forming regions 13, 13, . . . of the semiconductor substrate 1 become coarse surfaces by the scribing, the light-receiving efficiency thereof is lowered. However, the rear end portions where the junctions of the respective photodiode elements 9a, 9b and 9c are exposed can be formed as smooth surfaces and hence the light-receiving efficiency thereof can be improved whereby accurate inspection or testing can be carried out.

FIG. 5B illustrates the state after the etching treatment has been finished.

Subsequently, referring to FIG. 5C, the semiconductor laser chips 3, 3, . . . are positioned on the solder layers 2 of the respective semiconductor laser device-forming regions 13, 13, . . . . In this state, the semiconductor substrate wafer is passed through, for example, a heating furnace (heating temperature at about 250° C.) to thereby carry out the chip bonding of the respective semiconductor laser chips 3, 3, . . . to the front regions of the respective semiconductor laser device-forming regions 13, 13, . . . through the solder layers 2. FIG. 5C illustrates the state after the semiconductor laser chips 3 are bonded.

After only the chip bonding of the semiconductor laser chips 3, 3, . . . is carried out, whether the laser emission output exists or not is tested; whether the level or intensity of the laser emission output reaches to the prescribed reference value or not is tested; and whether the far field pattern is symmetrical or not is tested.. These tests will be described in detail later.

Thereafter, as FIG. 5D shows, the regions 14 are cut through by sawing to thereby complete the pelletizing. In this case, the width of the saw and the cutting position are determined so that the inclined faces 12f and 12r may not be damaged by the cutting saw. FIG. 5D shows the state after pelletizing.

Figure 7A:
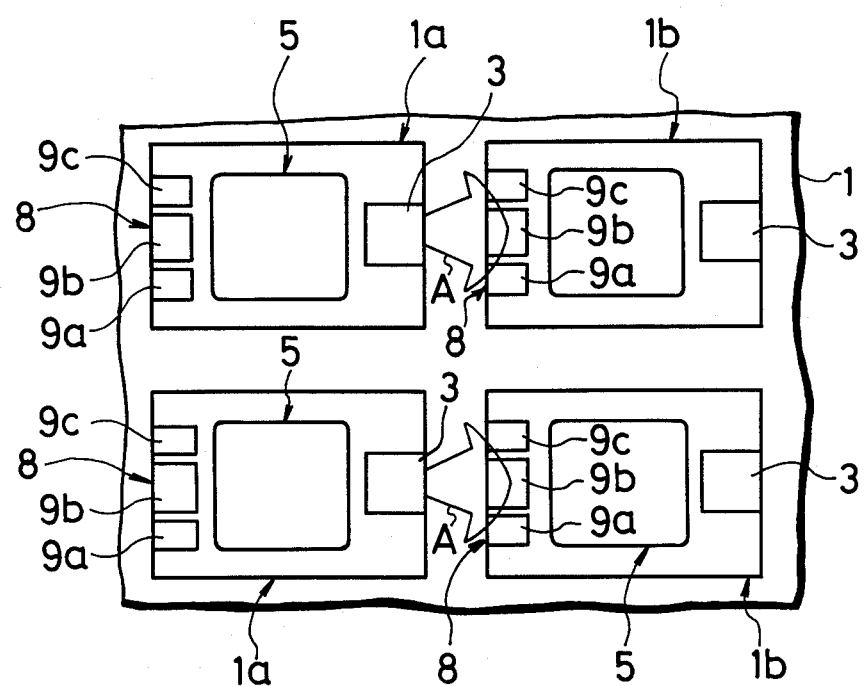
FIG. 7A is a plan view used to explain an improved testing method according to the invention.
Figure 7B:
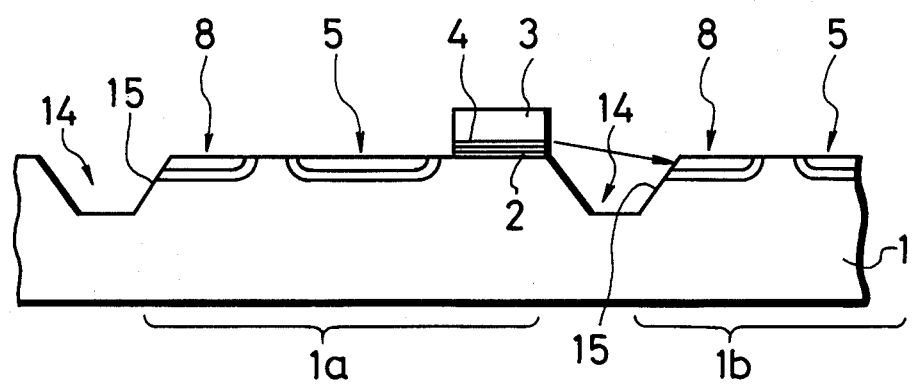
FIG. 7B is a cross-sectional view of FIG. 7A.

FIG. 6 is a cross-sectional view showing the manner in which the region 14 is cut for pelletizing. In FIG. 6, reference numeral 16 designates a saw. Next, with reference to FIGS. 7A and 7B, an explanation will be given regarding the testing method that is carried out for the laser emission output and the symmetry of the far field pattern before the pelletizing is carried out but after the chip bonding of the above mentioned semiconductor laser chips 3 has been completed.

Testing of the laser emission output and the far field pattern before the pelletizing is carried out by using a probe and the like. That is, with respect to one semiconductor laser device 1a, the laser emission output A from its semiconductor chip 3 is received by the testing photodiode 8 of another semiconductor laser device 1b adjacent to 1a at the front side thereof. More specifically, the central photodiode 9b of the laser device 1b is used to detect the laser emission output of the device 1a, and the ratio of light detecting amount of the central photodiode 9b to those of the photodiodes 9a and 9c provided at both sides of the photodiode 9b is calculated, whereby the symmetry of the far field pattern is tested.

According to the semiconductor laser device of my invention, as set forth above, since the testing photodiode is formed on the major surface of the semiconductor substrate at its region opposite to the bonding side of the semiconductor laser chip, in the stage before pelletizing, the testing of the laser emission output of the semiconductor laser chip in one semiconductor laser device can be carried out by using the testing photodiode of a second semiconductor laser device adjacent to the front side of the first device.

The above description is given on a single preferred embodiment of the invention but it will be apparent that many modifications and variations could be effected by one skilled in the art without departing from the spirit or scope of the novel concepts of the invention so that the scope of the invention should be determined by the appended claims only.

I claim as my invention:

1. A semiconductor device comprising:
   (a) a first photodetector constructed on one major surface of a semiconductor substrate;
   (b) a semiconductor laser chip mounted on said major surface at a position proximate to and on one side of said first photodetector; and
   (c) a second photodetector constructed on said major surface at a position proximate to said first photodetector, said second photodetector being constructed of said first photodetector opposite said semiconductor laser chip.

2. A semiconductor device according to claim 1, in which said second photodetector has an effective laser receiving region which extends onto the end face of said semiconductor substrate.

3. A semiconductor device according to claim 2, in which said second photodetector consists of a plurality of photodetectors positioned along said end face.

4. A semiconductor device according to claim 1, in which said first photodetector detects a part of laser emission from said semiconductor laser chip and operates to control the applied power to said semiconductor laser chip to regulate laser emission from said laser chip.

5. A semiconductor apparatus comprising: at least two semiconductor devices arranged on a layer of a semiconductor substrate, each of said at least two semiconductor devices having a first photodetector constructed on its top major surface, a semiconductor laser chip mounted on said top major surface at a position proximate to and on one side of said first photodetector, and a second photodetector constructed on said top major surface at a position proximate to said first photodetector, said second photodetector being constructed on the side of first photodetector opposite said semiconductor laser chip whereby said second photodetector of one device is used for testing a laser emission from a semiconductor laser chip of the other device, both of said devices being mounted on said semiconductor substrate proximate to but separate from each other.

6. A semiconductor device according to claim 3, in which said second photodetector is positioned to test a far field pattern of a laser emission from a semiconductor laser chip facing towards said second photodetector sidewards from an adjacent separate substrate.

7. A method of manufacturing and testing semiconductor devices comprising the steps of:
   providing a semiconductor substrate;

forming a first photodetector at a plurality of predetermined locations on the surface of said semiconductor substrate;

forming a second photodetector at a plurality of predetermined locations on the surface of said semiconductor substrate, each of said second photodetectors being formed at a position proximate to each of said first photodetectors;

depositing a solder layer at a plurality of predetermined locations on the surface of said semiconductor substrate, each of said solder layers being positioned proximate to each of said first photodetectors on the side of each of said first photodetectors opposite each of said second photodetectors;

etching a groove around each group of said first and second photodetectors and said solder layer to form groups of first and second photodetectors and said solder layer, said groove having side walls which are nonperpendicular to the major surface of said substrate;

providing a semiconductor laser chip for each of said solder layers;

using a probe in conjunction with said second photodetector of a first group of first and second photodetectors and said semiconductor laser chip, said second photodetector of said first group receiving the output of a laser chip from a second group of first and second photodetectors and semiconductor laser chip which is positioned proximate to said first group and is separated from said first group by said groove in order to test the laser emission output of each of said semiconductor laser chips;

sawing through said semiconductor substrate along said grooves to separate the individual groups of first and second photodetectors and semiconductor laser chips.

* * * * *